(12) United States Patent
Komatsu

(10) Patent No.: US 7,348,213 B2
(45) Date of Patent: Mar. 25, 2008

(54) METHOD FOR FORMING COMPONENT MOUNTING HOLE IN SEMICONDUCTOR SUBSTRATE

(75) Inventor: Ryuji Komatsu, Okaya (JP)

(73) Assignee: Nihon Micron Co., Ltd., Nagano (JP)

( * ) Notice: Subject to any disclaimer, the term of this patent is extended or adjusted under 35 U.S.C. 154(b) by 0 days.

(21) Appl. No.: 11/604,274

(22) Filed: Nov. 27, 2006

(65) Prior Publication Data
US 2007/0063343 A1 Mar. 22, 2007

Related U.S. Application Data

(62) Division of application No. 10/560,938, filed as application No. PCT/JP2004/008431 on Jun. 16, 2004, now abandoned.

(30) Foreign Application Priority Data
Jun. 16, 2003 (JP) ............................. 2003-170852

(51) Int. Cl.
*H01L 21/00* (2006.01)
(52) U.S. Cl. .................. 438/106; 438/42; 257/E21.499
(58) Field of Classification Search .................. 438/42, 438/108, 106; 257/E21.499
See application file for complete search history.

(56) References Cited

U.S. PATENT DOCUMENTS

| 6,222,246 | B1 | 4/2001 | Mak et al. |
| 6,272,020 | B1 * | 8/2001 | Tosaki et al. ............... 361/763 |
| 6,324,067 | B1 * | 11/2001 | Nishiyama ................... 361/761 |
| 6,809,268 | B2 | 10/2004 | Hayashi et al. |
| 2002/0086561 | A1 | 7/2002 | Ogawa et al. |
| 2004/0017012 | A1 * | 1/2004 | Yamada et al. ............. 257/774 |

FOREIGN PATENT DOCUMENTS

| JP | 2001-250885 A | 9/2001 |
| JP | 2002-261448 A | 9/2002 |
| JP | 2003-46255 A | 2/2003 |
| JP | 2003-51565 A | 2/2003 |
| JP | 2003-133507 A | 5/2003 |

* cited by examiner

*Primary Examiner*—Phat Xuan Cao
*Assistant Examiner*—Abul Kalam
(74) *Attorney, Agent, or Firm*—Birch, Stewart, Kolasch & Birch, LLP

(57) ABSTRACT

The present invention provides to a substrate for a semiconductor device, in which electric characteristics to high-speed signals are enhanced by facilitating the mounting of a circuit component, such as a decoupling capacitor, fabricated separately from the substrate. The substrate for a semiconductor device, on which the circuit component, such as a decoupling capacitor, can be mounted, is counterbored from the mounting surface side thereof, and a component mounting hole where a connection terminal, which will be electrically connected to the circuit component, is exposed in the inner bottom face is made by counterboring. The circuit component is mounted and electrically connected to the connection terminal, and a semiconductor element is mounted on the substrate by flip-chip connection.

7 Claims, 4 Drawing Sheets

METHOD FOR FORMING COMPONENT MOUNTING HOLE IN SEMICONDUCTOR SUBSTRATE

This application is a Divisional of application Ser. No. 10/560,938 filed on Dec. 15, 2005 now abandoned and for which priority is claimed under 35 U.S.C. § 120. application Ser. No. 10/560,938 is the national phase of PCT International Application No. PCT/JP2004/008431 filed on Jun. 16, 2004 under 35 U.S.C. § 371, and this application claims priority to application Ser. No. 2003-170852 filed on Jun. 16, 2003 in Japan under 35 U.S.C § 119. The entire contents of each of the above-identified applications are hereby incorporated by reference.

FIELD OF TECHNOLOGY

The present invention relates to a substrate for a semiconductor device and a semiconductor device, more precisely relates to a substrate for a semiconductor device, on which a circuit component, such as a decoupling capacitor, can be easily mounted, and a semiconductor device having the substrate.

BACKGROUND TECHNOLOGY

With faster ICs, a variation of electric current working therethrough must be great, and a source voltage is varied by high-speed switching so that they are apt to be badly influenced by noises. Further, an electric power consumption of ICs and driving voltage thereof are reduced, so the driving voltage is highly varied by a slight variation of the source voltage; namely ICs are apt to be badly influenced by a voltage variation. The above described problems disturb faster ICs, thus a decoupling capacitor is provided between a source line and an earth line of a semiconductor element to solve the problems.

In case of providing the decoupling capacitor, an IC is highly densified and number of working elements in the IC must be increased, so a high-capacity capacitor must be provided and located close to the working elements so as to shorten signal paths and reduce inductance to high-speed signals. Thus, conventionally, the capacitor is provided on a semiconductor element mounting surface of a substrate or on the opposite surface thereof and immediately under the semiconductor element so as to locate the capacitor close to the semiconductor element.

Note that, substrates for semiconductor devices, in each of which a decoupling capacitor is formed instead of the capacitor separated from the substrate, were invented. For example, the decoupling capacitor is formed by a build-up process when a cable layer is formed on the substrate (see Patent Document 1), and the decoupling capacitor and a cable layer are formed in a circuit board and used as an interposer (see Patent Document 2).

Patent Document 1: Japanese Patent Laid-open Gazette No. 2003-133507; and

Patent Document 2: Japanese Patent Laid-open Gazette No. 2001-250885

SUMMARY OF THE INVENTION

In comparison with the substrate on which the decoupling capacitor, e.g., chip capacitor, is mounted, the substrate in which the decoupling capacitor is formed can shorten a cable length between the semiconductor element and the decoupling capacitor, so that inductance of the circuit can be reduced. However, in the case of forming the decoupling capacitor in, for example, a build-up layer, the capacity must be 1/10,000-1/10 of that of the substrate in which the capacitor is set, so the substrate cannot suitably meet the speeding up ICs.

On the other hand, in the case of mounting the capacitor, e.g., chip capacitor, on the substrate, the capacitor having large capacity, which has enough decoupling function, can be easily mounted, but the cable length to the semiconductor element must be longer than that of the substrate in which the decoupling capacitor is set. In the case of providing the decoupling capacitor immediately under the semiconductor element, the cable length between the IC and the decoupling capacitor may be shortened by reducing thickness of the substrate, but the substrate cannot have prescribed strength and will be deformed by thermal stress between the semiconductor element and the substrate. In case of mounting circuit components on the surface opposite to the semiconductor element mounting surface, the circuit components must be lower than solder bumps, so only the thin circuit components can be mounted; namely it is difficult to mount the capacitor having enough capacity on the substrate.

A capacitor may be implanted near the surface of the substrate and a cable layer or layers may be formed thereon by the build-up process, but it is difficult to flatten a top part of the implanted capacitor; therefore a thick capacitor cannot be implanted, and enough capacity cannot be gained. Further, thermal stress working between the semiconductor element, the substrate and the capacitor lower reliability of connected parts thereof. Thus, it is difficult to apply this method to mass-producing the substrates of semiconductor devices.

Thus, the present invention was conceived to solve the above described problems, and an object of the present invention is to provide a substrate for a semiconductor device and a semiconductor device, which are capable of highly shortening a cable length between a working part of a semiconductor element and a circuit component, e.g., decoupling capacitor, so as to effectively reduce circuit inductance, corresponding to further speed-up of semiconductor elements by facilitating the mounting of the circuit component, e.g., decoupling capacitor, fabricated separately from the substrate and being mass-produced.

To achieve the object, the present invention has following structures.

Namely, the substrate for a semiconductor device, on which a circuit component can be mounted, is characterized in that a surface opposite to an element mounting surface is counterbored so as to form a component mounting hole where a connection terminal, which will be electrically connected to the circuit component, is exposed in the inner bottom face.

In the substrate, the substrate may be constituted by a core plate and a cable layer or layers formed on the core plate, and the surface of the substrate, which is opposite to the element mounting surface thereof, may be counterbored so as to form a component mounting hole where a connection terminal, which is formed in the cable layer, is exposed in the inner bottom face. With the element mounting hole formed by counterboring the substrate, the circuit component can be mounted by effectively using thickness of the substrate, so that the circuit component, e.g., decoupling capacitor having large capacity, can be easily mounted and superior electric characteristics to high-speed signals can be gained.

In the substrate, the component mounting hole may be located in a semiconductor element mounting area; a cable length between the semiconductor element and the circuit component can be effectively shortened, so that electric characteristics to high-speed signals can be improved.

In the substrate, the circuit component, which is electrically connected to the connection terminal, may be mounted in the component mounting hole. The substrate may be provided in a state, in which the circuit component is mounted in the component mounting hole. Especially, the substrate, in which a decoupling capacitor is mounted as the circuit component, can be suitably used.

Further, the semiconductor element may be mounted on the substrate by flip-chip connection. Since the semiconductor element is mounted on the substrate by flip-chip connection, the cable length between the semiconductor element and the circuit component can be effectively shortened; therefore, circuit inductance can be reduced, and the semiconductor device having superior electric characteristics to high-speed signals can be produced.

PREFERRED EMBODIMENTS OF THE INVENTION

Figure 1:
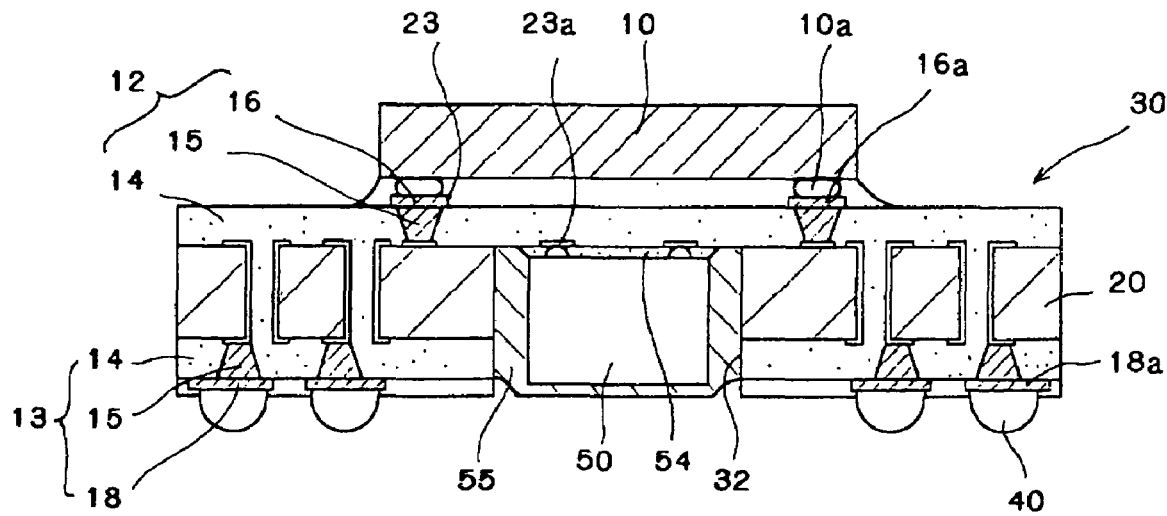
FIG. 1 is a sectional view of an embodiment of a semiconductor device of the present invention.

Preferred embodiments of the present invention will now be described in detail with reference to the accompanying drawings. FIG. 1 is a sectional view of a semiconductor device, in which a semiconductor element 10 is mounted on a substrate 30 of the present invention by flip-chip connection.

Circuit components 50, e.g., decoupling capacitor, fabricated separately from the substrate 30 are mounted on the substrate, a surface opposite to a semiconductor element mounting surface is counterbored so as to form a component mounting hole 32, and the circuit components 50 are accommodated in the component mounting hole 32.

The component mounting hole 32 is formed by counterboring the substrate, it is a concave capable of accommodating one or a plurality of the circuit components 50, connection terminals 23a, which are electrically connected to the semiconductor element 10, are exposed in an inner bottom face of the component mounting hole, and the connection terminals 23a, which are electrically connected to the circuit components 50. In the drawing, solder bumps 52 are formed on electrodes of the circuit components 50 so as to solder-connect the circuit components 50 to the connection terminals 23a.

After the circuit components 50 is connected to the connection terminals 23a, a space between the circuit components 50 and inner faces of the component mounting hole 32 is filled with an under filling material 55 so as to securely connect the circuit components 50 to the connection terminals 23a and encapsulate the circuit components 50.

Note that, the circuit components 50 may be electrically connected to the connection terminals 23a by ordinary solder, electroconductive paste, anisotropic electroconductive film, etc. instead of the solder bumps 52.

The substrate 30 comprises a core plate 20 and cable layers 12 and 13, which include prescribed cable patterns 16 and 18 and which are respectively provided to the both surfaces of the core plate. Symbols 14 stand for electric insulation layers, and symbols 15 stand for vias.

In the substrate 30 of the present embodiment, the semiconductor element 10 is mounted by flip-chip connection, and connection pads 16a, which respectively corresponds to the electrodes of the semiconductor element 10, are formed on the semiconductor element mounting surface. The semiconductor element 10 is flip-chip-connected to the connection pads 16a by the solder bumps 10a, and a space between the semiconductor element 10 and the substrate is filled with an under filling material.

In the present embodiment, the cable layer 12 is a single layer, in which the connection pads 16a are electrically connected to cable patterns 23 formed on the surface of the core plate 20 by the vias 15; in another case, a plurality of layered cable patterns may be formed in the cable layer. Further, the core plate may have a layered structure.

Electroconductive sections 22 are formed in the core plate 20, lands 18a are formed in the cable layer 13, and connection terminals 40 are respectively connected to the lands 18a. The semiconductor element 10 is electrically connected to the connection terminals 40 via the vias 15, the electroconductive sections 22, etc.

In the present embodiment, the surface of the substrate 30 is counterbored, by a cutting blade, so as to form a concave having a prescribed depth.

There are several methods for counterboring a multilayered circuit board so as to expose an inner electroconductive layer; in the present embodiment, the cutting blade rotating at high speed is moved into the substrate, and the cutting position of the blade is controlled by detecting the moment of contacting an inner electroconductive layer by a sensor. By rotating the blade at high speed and precisely detecting the moment when the blade contacts the inner electroconductive layer, the inner electroconductive layer can be efficiently exposed without overcutting the substrate.

Actually, by improving accuracy of detecting the blade, if thickness of the inner electroconductive layer is 35 μm or more, the inner electroconductive layer can be exposed with the surface being counterbored 20% or less.

As shown in FIG. 1, the circuit components 50 are mounted in the component mounting hole 32, which is formed by counterboring the substrate 30 of the present embodiment, so that the circuit components 50 can be arranged at a position or positions immediately under the semiconductor element 10 and across the cable layer 12 and cable lengths between the semiconductor element 10 and the circuit components 50 can be highly shortened. In the drawings, the semiconductor element 10 is connected to the circuit components 50 by the connection pads 16a, the vias 15 and the cable patterns formed on the surface of the core plate 20. The circuit components 50 are accommodated in the component mounting hole 32 and arranged most close to the electrodes of the semiconductor element 10.

In the substrate 30 of the present embodiment, the cable length between the semiconductor element 10 and the decoupling capacitor can be shortened, so that circuit inductance to high-speed signals can be effectively reduced.

Since the depth of the component mounting hole 32 is deeper than thickness of the core plate 20, the circuit components 50, e.g., chip capacitor, which can be accommodated in the component mounting hole 32, can be mounted on the substrate. Actually, even if the circuit components 50 project from the component mounting hole 32, they can be mounted as far as their heights are lower than the connection terminals 40, e.g., solder balls. Further, a cable layer may be formed on the surface of the core plate 20, and the counterboring may be executed until reaching an inner part of the cable layer so as to make the component mounting hole 32 deeper.

The substrate 30 of the present embodiment is characterized in that the circuit components 50 are mounted in the substrate by using the thickness thereof, so that the circuit components can be mounted without making the semiconductor device thicker. In the substrate shown in FIG. 1, the cable layer is formed on the core plate 20, and thickness of the core plate 20 consists mostly of total thickness of the substrate; the method of mounting the circuit components 50 by using the thickness of the substrate is an effective method of mounting the circuit components 50 without changing total thickness of the semiconductor device. Therefore, a thick capacitor can be mounted in the substrate, and a capacitor having enough capacity can be mounted as a decoupling capacitor. Since the core plate 20 has enough strength, the substrate 30 is capable of resisting thermal stress produced between the semiconductor element 10 and the substrate 30 when the semiconductor element 10 is mounted by flip-chip connection.

Figure 2:
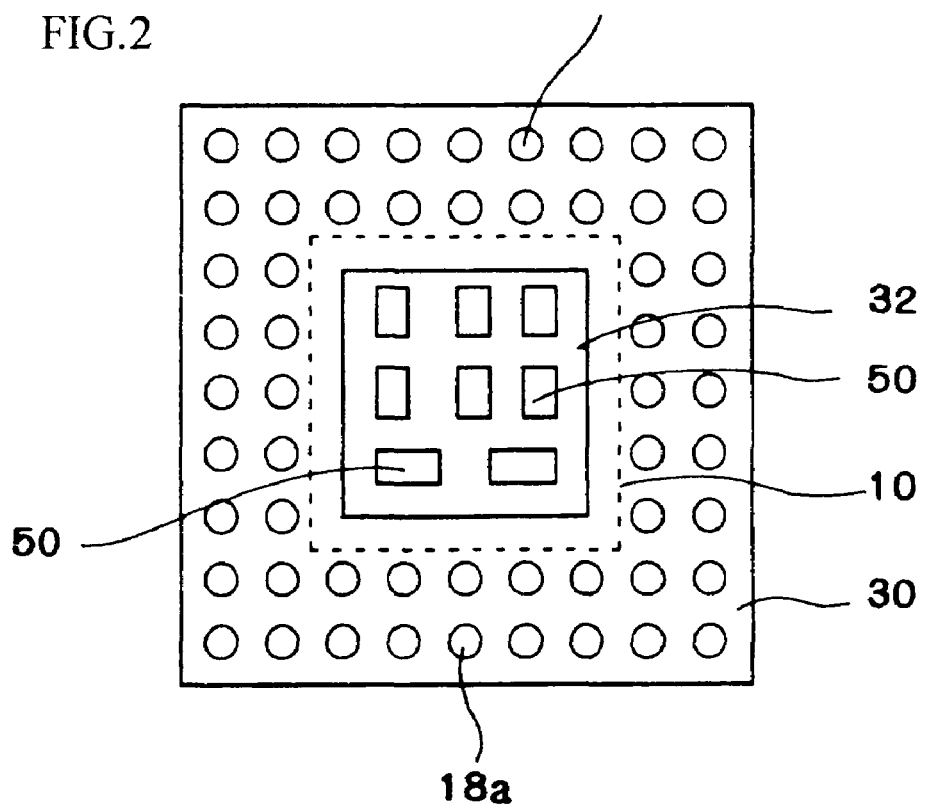
FIG. 2 is a bottom view of a substrate for a semiconductor device of the embodiment.

FIG. 2 shows the substrate 30 seen from the surface opposite to the semiconductor element mounting surface. In the substrate 30 of the present embodiment, the component mounting hole 32 is located within a semiconductor element mounting area, and a plurality of the circuit components 50 are arranged therein. The arrangement of the circuit components 50 is designed to highly shorten cable lengths between the semiconductor element 10 and the circuit components 50. These days, the semiconductor element 10 has complex functions and is constituted as a composite body of elements working concurrently. The circuit components 50 are respectively arranged close to the corresponding elements.

Note that, in the actual step of forming the component mounting hole 32, a plurality of the substrates are formed by cutting a large plate, so a plurality of the component mounting holes 32 are counterbored, for each of the substrates, therein.

FIGS. 3 and 4 show the steps of producing the substrate 30 shown in FIG. 1.

In the substrate 30, cable layers are formed on the both side faces of the core plate 20 by a known process, e.g., build-up process, and the process of forming the cable layers is not limited. The substrate 30 shown in FIG. 1 has the filled vias; a process for forming cable layers by using copper film including copper bumps will be explained hereinafter.

Figure 3A:
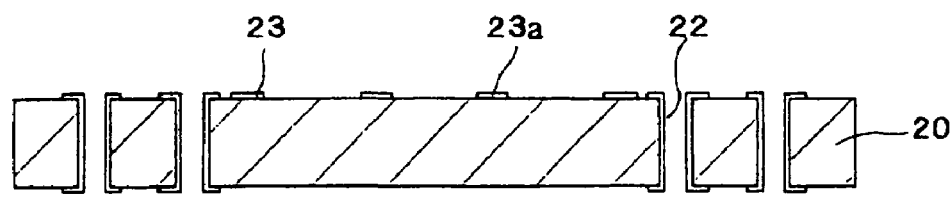
FIGS. 3A-3D are explanation views showing a method of producing the substrate for a semiconductor device.

FIG. 3A shows the plastic core plate 20 constituting the substrate 30 for the semiconductor device. The core plate 20 is formed by the steps of: boring through-holes in a plastic plate whose both side faces are coated with copper films; plating the through-holes so as to form the electroconductive sections 22; and etching the copper films coating the both side faces of the plate so as to form cable patterns 23. The connection terminals 23a, which will be connected to the circuit components 50, are formed on the side face of the core plate 20, on which the semiconductor element 10 will be mounted.

Figure 3B:
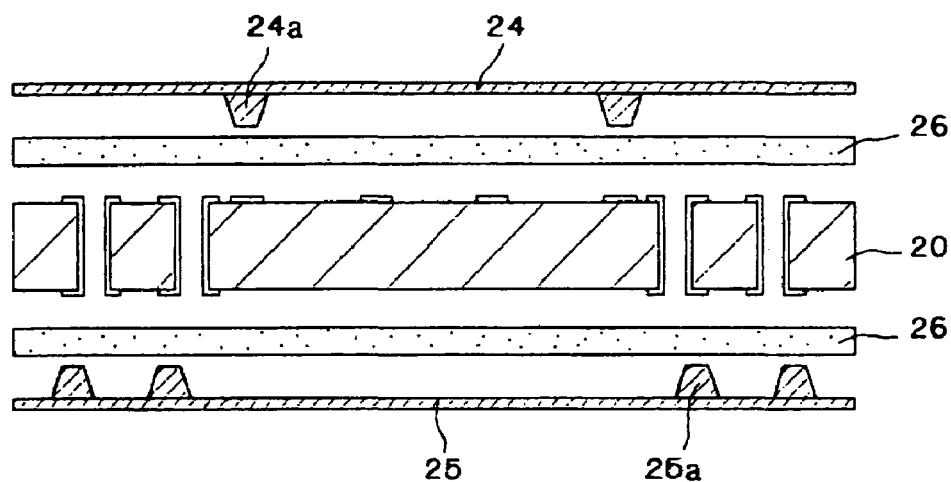
Figure 3C:
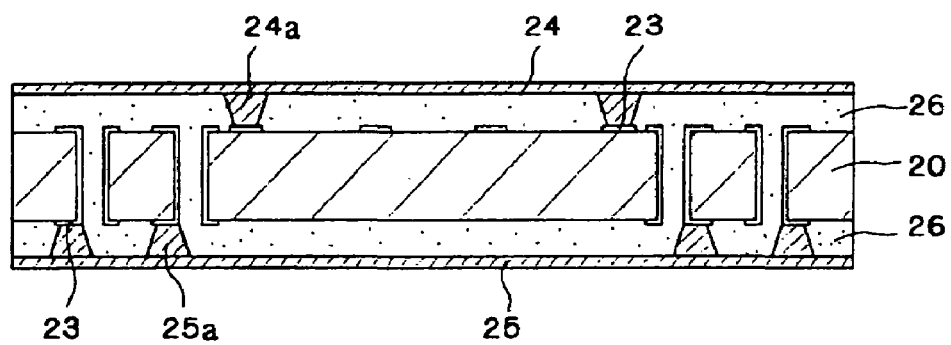

FIG. 3B shows the step of adhering the copper films 24 and 25 including copper bumps on the both side faces of the core plate 20. Copper bumps 24a and 25a are respectively formed in the copper films 24 and 25. The copper bumps 24a and 25a correspond to the cable patterns 23 of the core plate 20.

Prepregs 26 are provided to adhere the copper films 24 and 25 onto the core plate 20. The core plate 20 is sandwiched between the copper films 24 and 25 together with the prepregs 26, and they are pressurized and heated so that the copper films are adhered on the both side faces of the core plate 20. During this step, front ends of the copper bumps 24a and 25a of the copper films 24 and 25 fit with the cable patterns 23 of the core plate 20, so that the copper bumps 24a and 25a electrically connected to the cable patterns 23. Diameters of the front ends of the copper bumps 24a and 25a are small, so that the front ends can be securely fitted and connected with the cable patterns 23. By melting and solidifying the prepregs, the copper films 24 and 25 can be integrated with the core plate 20 with the copper bumps 24a and 25a fitting with the cable patterns 23 (see FIG. 3C).

Figure 3D:
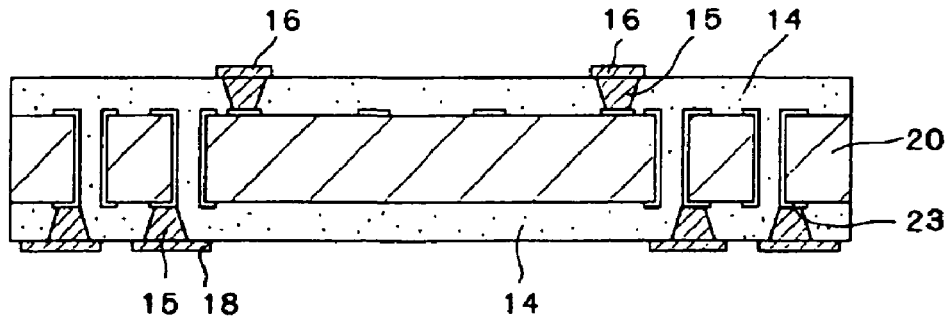

In FIG. 3D, film parts of the copper films 24 and 25, which have been adhered to the core plate 20, are etched to form the cable patterns 16 and 18 on the both surfaces of the substrate. Since the copper bumps 24a and 25a are integrated with the copper films 24 and 25, the cable patterns in different layers are electrically connected via the copper bumps 24a and 25a by etching the film parts to form the cable patterns 16 and 18. In this case, the copper bumps 24a and 25a work as filled vias, and the prepregs 26 work as the electric insulation layers 14, which insulate the cable patterns in the different layers.

Figure 4A:
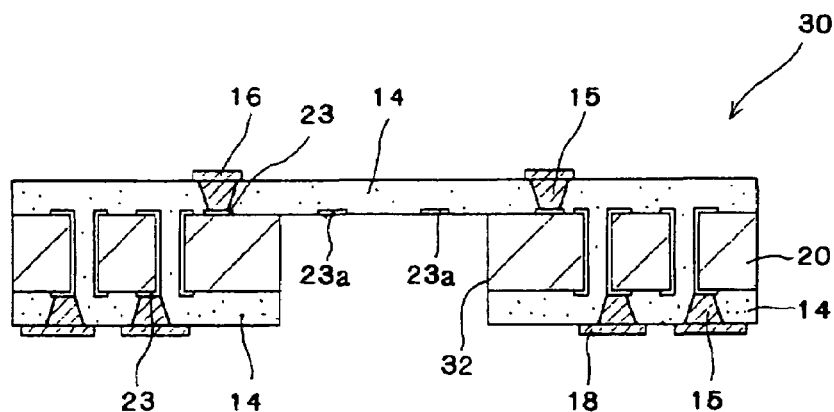
FIGS. 4A-4C are explanation views showing the method of producing the substrate for a semiconductor device.

FIG. 4A shows the most unique step of counterboring the core plate 20 so as to form the component mounting hole 32. The cutting blade rotating is moved into the surface of the substrate 30, which is opposite to the semiconductor element mounting surface, to cut the insulation layer 14 and the core plate 20 in the thickness direction so that the component mounting hole 32 can be formed.

In the component mounting hole 32, lower end faces of the connection terminals 23a, which are formed on the upper face of the core plate 20 (which contact the core plate 20), are slightly cut by the cutting blade for counterboring, so that the connection terminals 23a are exposed in an inner bottom face. The cutting blade is moved within an area of forming the component mounting hole 32, so that the component mounting hole 32 having a prescribed size can be formed.

Figure 4B:
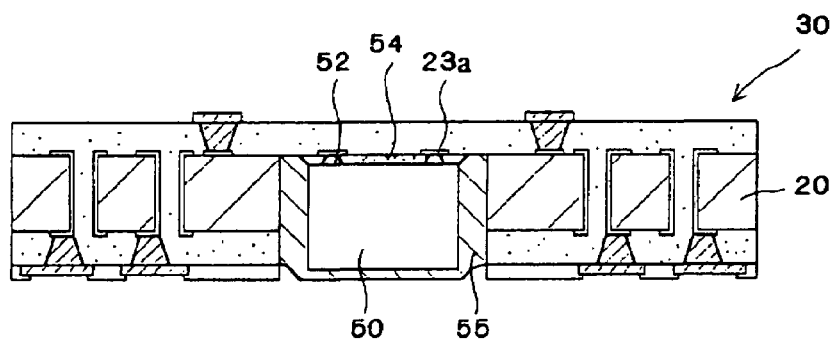

After counterboring the component mounting hole 32, the connection terminals 23a exposed in the inner bottom face of the component mounting hole 32 are plated if required, then the circuit components 50 are mounted (see FIG. 4B). The circuit components 50 are mounted in the component mounting hole 32 and electrically connected to the connection terminals 23a by solder bumps, ordinary solder, electroconductive paste, anisotropic electroconductive films, etc.

Note that, the substrate 30 may be shipped in the state shown in FIG. 4A, in which the component mounting hole 32 is bored in the substrate, or in the state shown in FIG. 4B, in which the circuit components 50 are mounted in the component mounting hole 32.

Figure 4C:
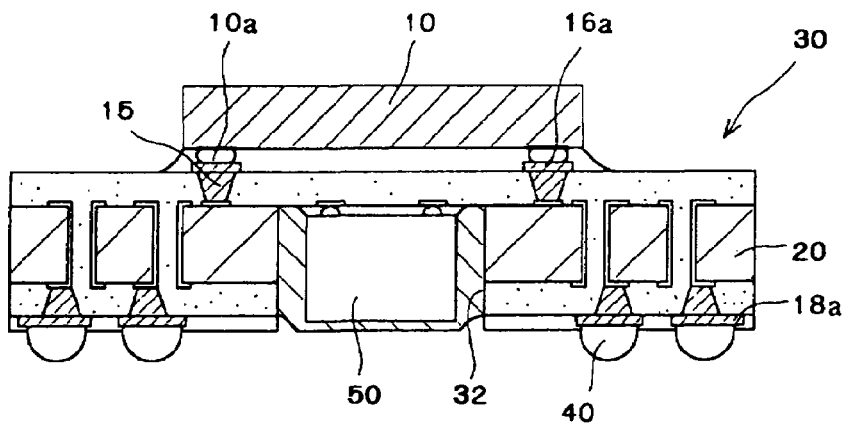

In FIG. 4C, the semiconductor element 10 is mounted on the substrate 30, which has been produced by the above described process, by flip-chip connection, and the connection terminals 40 are connected to the lands 18a.

In the above described process of producing the substrate 30, the copper films 24 and 25 are adhere to the core plate 20, then the component mounting hole 32 is formed by counterboring. The method of counterboring the component mounting hole 32 after forming the cable patterns on one or both of the side faces of the core plate 20 is an effective method of precisely forming cable patterns, etc. and mounting the circuit components 50. In case of previously forming the component mounting hole 32, in which the circuit components 50 will be mounted, then forming cable layers on the both side faces of the core plate 20, a step of covering or filling the component mounting hole 32 with any member or material must be required before forming cable layers, so it is an impractical method.

In the case of counterboring the component mounting hole 32 in the substrate 30 for the semiconductor device, the component mounting hole 32 is counterbored after forming a circuit board, therefore the circuit board can be formed by an ordinary method. Namely, by the process of the present invention, the component mounting hole 32, in which the circuit components 50 will be mounted, can be formed by counterboring to expose the inner electroconductive layer after the circuit board, e.g., multilayered board, build-up board, is formed by the ordinary method; further, the substrate for a semiconductor device, which includes fine cable patterns, can be produced by counterboring the circuit board, in which the fine cable patterns have been formed.

Figure 5:
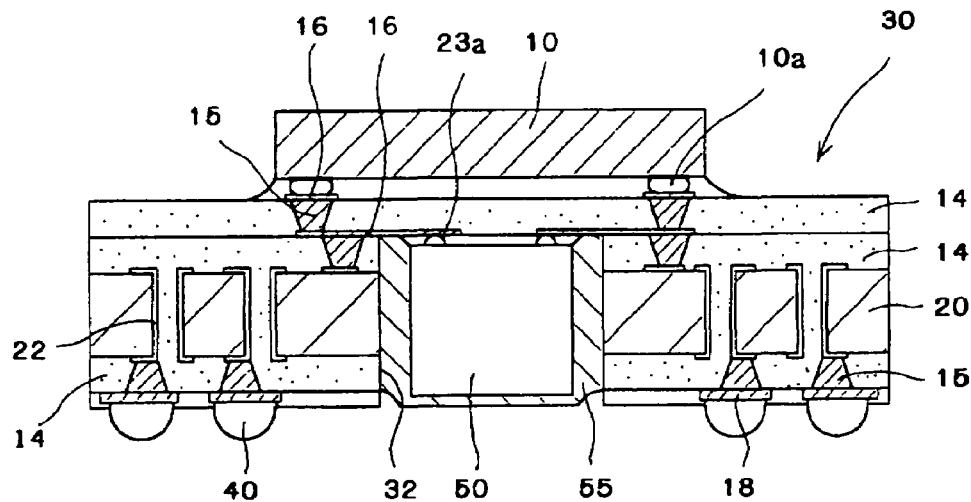
FIG. 5 is a sectional view of another embodiment of a semiconductor device of the present invention.

FIG. 5 shows a semiconductor device, in which the substrate 30 is constituted by the core plate 20 and a plurality of cable layers formed on the element mounting surface thereof, the component mounting hole 32 is formed in the core plate, and the semiconductor element 10 is mounted on the substrate 30. In the cable layers formed on the element mounting surface of the core plate 20, the cable patterns 16 in the different layers are electrically connected by the vias 15.

In the present embodiment, the copper films shown in FIGS. 3 and 4, which include the copper bumps, are used, and the cable patterns 16 in the different layers are electrically connected by the filled vias 15, but the cable patterns 16 in the different layers may be electrically connected by other means, e.g., plating vias, forming filled vias, filling electroconductive paste in via holes. The counterboring the component mounting hole 32 is not restricted by the process for forming the cable layers. The step of exposing the ends of the connection terminals 23a by cutting may be applied to any types of vias.

In the embodiment shown in FIG. 5, the component mounting hole 32 is formed by cutting to expose the inner electroconductive layer of the cable layer formed on the element mounting surface side of the core plate 20. In the embodiment shown in FIG. 1, the counterboring is performed until reaching the surface of the core plate 20; further, as described in the present embodiment, the couterboring may be performed until reaching the inner layer of the multilayered cable layers so as to expose the connection terminals in the inner bottom face of the component mounting hole 32.

In the drawing, thickness of the cable layers, which are formed on the element mounting surface of the core plate 20, are enlarged with respect to thickness of the core plate 20. In actual multilayered circuit boards, the cable layers formed on the surface of the core plate 20 is much thinner than the core plate 20. Therefore, accommodating the circuit components 50 in the substrate by using the thickness of the core plate 20 is an effective mounting method, and the cable lengths between the semiconductor element 10 and the circuit components 50 can be effectively shortened.

Figure 6:
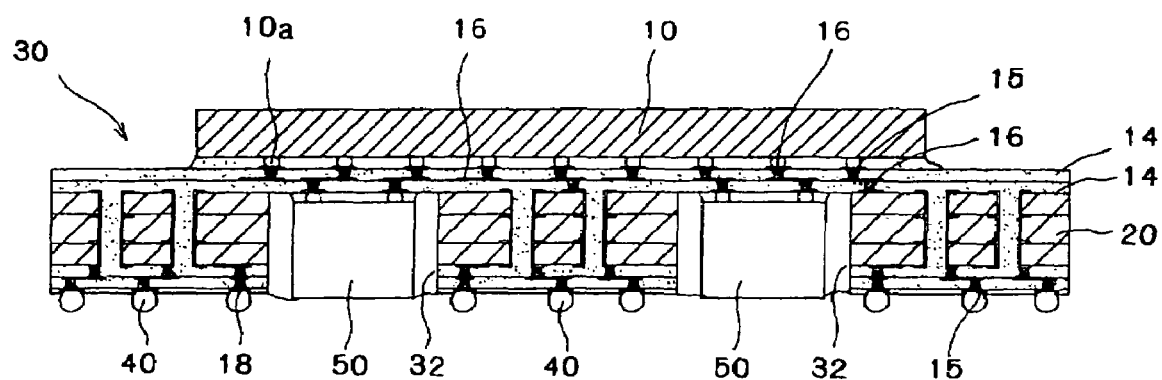
FIG. 6 is a sectional view of yet another embodiment of a semiconductor device of the present invention.

FIG. 6 shows a semiconductor device, in which the semiconductor element 10 is mounted on the substrate 30 including a multilayered core plate 20. In the substrate 30, a plurality of cable layers are formed on the both side faces of the core plate 20. In the present embodiment too, the surface of the substrate 30, which is opposite to the element mounting surface, is counterbored to form the component mounting holes 32, and the circuit components 50 are mounted in the component mounting holes 32. A multilayered cable layers are formed on the both side faces of the core plate 20.

As described above, the substrate for a semiconductor device may have following structures: the substrate in which cable patterns are formed on both side faces of a plate as the core plate and a cable layer or layers are formed on the both side faces of the core plate by, for example, the build-up process; the substrate in which the core plate is a multilayered plate including inner cable patterns and a cable layer or layers are formed on the both side faces of the core plate; and the substrate in which cable layers are formed by the build-up process only without using a core plate. In the present invention, the above described substrates can be used. The substrate whose core plate is a multilayered core plate including inner cable patterns may be counterbored until the inner cable patterns are exposed, and a decoupling capacitor may be mounted therein. Further, an ordinary multilayered substrate may be counterbored until reaching an inner layer, and a decoupling capacitor may be mounted therein.

Note that, in the above described embodiments, the semiconductor element 10 is mounted by flip-chip connection; in case of mounting the semiconductor element 10 by wire bonding, etc. too, the substrate may be counterbored and a decoupling capacitor may be mounted therein by using the thickness of the substrate.

Further, in the above described embodiments, decoupling capacitors are mounted as the circuit components 50, but other components, e.g., resistance, can be mounted as the circuit components 50. In the above described embodiments, one semiconductor element 10 is mounted on one package, but a plurality of semiconductor elements may be mounted on one package, the component mounting hole or holes 32 may be formed for each semiconductor element and the circuit components 50 may be mounted in the component mounting hole or holes 32 so that a composite package, in which electric characteristics to high-speed signals are enhanced, can be produced.

The invention claimed is:

1. A method of manufacturing a substrate for a semiconductor element, said method comprising:
    forming connection terminals on a first surface of a substrate, said first surface corresponding to a surface on which the semiconductor element is to be mounted;
    counterboring a second surface of the substrate that is opposite to the first surface using a cutting blade until the cutting blade contacts the connection terminals so as to expose the connection terminals and form a circuit component mounting hole;
    determining when the cutting blade contacts the connection terminals using a sensor; and
    controlling a speed of the cutting blade based on the determining step such that the cutting blade cuts into the substrate until the connection terminals are exposed and then stops cutting into the substrate.

2. The method according to claim 1, further comprising:
    forming metal films including connection bumps onto both the first and second surfaces of the substrate,
    wherein the connection bumps on the first surface contact the connection terminals.

3. The method according to claim 2, wherein the metal films comprise copper films.

4. The method according to claim 1, further comprising:
    mounting a circuit component into the circuit component mounting hole such that the circuit component is electrically connected to the connection terminals.

5. The method according to claim 4, further comprising:
    mounting the semiconductor element over the first surface of the substrate such the semiconductor element is electrically connected to the circuit component.

6. The method according to claim 4, wherein the circuit component is a capacitor.

7. The method according to claim 1, wherein the circuit component mounting hole is formed in a planar area of the substrate corresponding to a semiconductor element area.

* * * * *